(12) United States Patent
Heinemann et al.

(10) Patent No.: US 11,740,068 B2
(45) Date of Patent: Aug. 29, 2023

(54) SCANNING ELEMENT AND INDUCTIVE POSITION MEASURING DEVICE THEREWITH

(71) Applicant: DR. JOHANNES HEIDENHAIN GmbH, Traunreut (DE)

(72) Inventors: Christoph Heinemann, Übersee (DE); Marc Oliver Tiemann, Waging am See (DE)

(73) Assignee: DR. JOHANNES HEIDENHAIN GmbH, Traunreut (DE)

( * ) Notice: Subject to any disclaimer, the term of this patent is extended or adjusted under 35 U.S.C. 154(b) by 258 days.

(21) Appl. No.: 17/411,101

(22) Filed: Aug. 25, 2021

(65) Prior Publication Data

US 2022/0065610 A1 Mar. 3, 2022

(30) Foreign Application Priority Data

Aug. 25, 2020 (EP) ..................................... 20192523

(51) Int. Cl.
*G01B 7/30* (2006.01)
*G01D 5/20* (2006.01)
*H05K 1/02* (2006.01)

(52) U.S. Cl.
CPC .................. *G01B 7/30* (2013.01); *G01D 5/20* (2013.01); *H05K 1/0218* (2013.01); *H05K 1/0298* (2013.01); *H05K 2201/10151* (2013.01)

(58) Field of Classification Search
CPC .......... G01B 7/30; G01D 5/20; H05K 1/0218; H05K 1/0298; H05K 2201/10151
See application file for complete search history.

(56) References Cited

U.S. PATENT DOCUMENTS

| 2016/0209240 A1 | 7/2016 | Pfaffinger et al. |
| 2021/0010793 A1 | 1/2021 | Irle et al. |
| 2022/0178672 A1* | 6/2022 | Heinemann ............ G01B 7/003 |

FOREIGN PATENT DOCUMENTS

| DE | 102014201975 A1 | 3/2015 |
| FR | 2800457 A1 | 5/2001 |
| WO | 2019/185336 A1 | 10/2019 |

OTHER PUBLICATIONS

European Search Report issued in corresponding EP Application No. EP20192523, dated Feb. 3, 2021, pp. 1-2.

* cited by examiner

*Primary Examiner* — Minh Q Phan
(74) *Attorney, Agent, or Firm* — CARTER, DELUCA & FARRELL LLP

(57) ABSTRACT

A scanning element includes a circuit board and electronic components. The circuit board includes first and second shielding layers, a first detector unit is arranged in first and second layers, and a second detector unit is arranged in third and fourth layers. A first straight line passes through the first detector unit and the first shielding layer but not through the second shielding layer. Starting from the first detector unit, the first shielding layer is located beyond the center plane. A second straight line passes through the second detector unit and the second shielding layer but not through the first shielding layer. Starting from the second detector unit, the second shielding layer is located beyond the center plane. The first and second straight lines are orthogonal to the center plane.

20 Claims, 5 Drawing Sheets

SCANNING ELEMENT AND INDUCTIVE POSITION MEASURING DEVICE THEREWITH

CROSS-REFERENCE TO RELATED APPLICATIONS

The present application claims priority to Application No. 20192523.7, filed in the European Patent Office on Aug. 25, 2020, which is expressly incorporated herein in its entirety by reference thereto.

FIELD OF THE INVENTION

The present invention relates to a scanning element for an inductive position measuring device for determining the position of the scanning element relative to two scale elements which are able to move at different speeds.

BACKGROUND INFORMATION

For example, inductive position measuring devices are used as angle encoders for determining the angular position of machine components that are rotatable relative to one another. In inductive position measuring devices, exciter leads and receiver tracks, such as in the form of conductor tracks, are often mounted on a shared, often multilayer circuit board, which is firmly connected to a stator of an angle encoder, for example. Situated opposite this circuit board is a scale element on which graduation structures are applied and which is connected to the rotor of the angle encoder in a torsionally fixed manner. If an electrical excitation current that varies over time is applied to the exciter leads, signals that are a function of the angular position are generated in the receiver coils during the relative rotation between the rotor and stator. These signals are then further processed in an evaluation electronics.

Particularly in drives of robots, inductive position measuring devices are frequently used as measuring devices for determining the angular position of a drive shaft and simultaneously for the exact determination of the angular position of an output shaft, in which case the movement of the drive shaft is introduced through a reduction gear unit into the output shaft.

Inductive position measuring devices are also used as linear encoders for determining the position of two machine components that are displaceable relative to each other, in particular, in a linear manner.

PCT Patent Document No. WO 2019/185336 describes a scanning element that has a transmit coil and sensor coils, which are situated on a multilayer circuit board, and the circuit board has layers that are arranged as a shield.

SUMMARY

Example embodiments of the present invention provide a scanning element for an inductive position measuring device, which operates in a relatively precise manner, can be produced economically, and may be used to determine positions of two scale elements. In this context, angular positions or angle settings may be measured with the aid of a scanning element that includes a circuit board which is provided with corresponding detector units on both sides so that it is possible to determine the respective angular positions of scale elements arranged in a rotatable manner on both sides of the circuit board. Additionally, a scale element having detector units situated on both sides is able to be used in connection with a linear encoder.

According to an example embodiment of the present invention, a scanning element, which is configured for use in an inductive position measuring device, includes a multilayer circuit board having a first detector unit, a second detector unit, and electronic components. For example, the first detector unit is arranged on a first side of the circuit board, and the second detector unit is arranged on a second side of the circuit board. The first detector unit has a first excitation track and a first receiver track. The second detector unit has a second excitation track and a second receiver track. In addition, the circuit board has a first shielding layer, a second shielding layer, and a geometrical center plane, which is, for example, arranged in the center between the first side and the second side of the circuit board, the center plane being located between the detector units and the shielding layers. The multilayer circuit board is furthermore configured so that the first detector unit is arranged in a first layer and in a second layer and, in addition, the second detector unit is arranged in a third layer and in a fourth layer. The shielding layers are dimensioned or have a size such that an imaginary geometrical first straight line passes through or intersects both the first detector unit and the first shielding layer, whereas the first straight line does not pass through the second shielding layer. Starting from the first detector unit, the first shielding layer is arranged beyond the center plane. In addition, an imaginary geometrical second straight line passes through or intersects both the second detector unit and the second shielding layer, whereas the second straight line does not pass through the first shielding layer. Starting from the second detector unit, the second shielding layer is arranged beyond the center plane. The first straight line and the second straight line have an orthogonal orientation with respect to the center plane.

The first straight line may intersect or pass through the first detector unit in the region of the first excitation track or in the region of the first receiver track. The second straight line may intersect or extend through the second detector unit in the region of the second excitation track or in the region of the second receiver track. The first excitation track and the second excitation track include excitation circuit tracks that extend in different layers (i.e., in the first, second, third, and fourth layer) of the circuit board. In the same manner, the first receiver track and the second receiver track include receiver circuit tracks that extend in the first, second, third and fourth layer of the circuit board.

With a view toward specifying the spatial placement of the subject matter hereof, a first direction x is able to be defined to begin with. First direction x represents the particular direction in which the searched for position is measured (measuring direction). First direction x, for example, may be a circumferential direction or a tangential direction. In this case, an angular position of the scale element relative to the scanning element with regard to a rotary or pivot movement about an axis (of rotation) is able to be measured by the position measurement in the first direction. In the case of a linear position measurement, first direction x extends along the linear measured distance.

In addition, a second direction y may be defined, which has an orthogonal orientation relative to first direction x.

A third direction z extends orthogonal to first direction x and also orthogonal to second direction y. For example, third direction z may extend in parallel with the axis (of rotation) about which a scale element is rotatable relative to the scanning element. In addition, third direction z has an orthogonal alignment to the center plane. The individual layers of the circuit board are arranged at an offset from one another in third direction z.

The center plane is located between the first detector unit and the first shielding layer in relation to third direction z, or the first detector unit and the first shielding layer are located on both sides of the center plane. As a result, it is also the case that the center plane is located between the second detector unit and the second shielding layer in relation to the third direction z, or that the second detector unit and the second shielding layer are located on both sides of the center plane.

The first shielding layer may be arranged in a fifth layer of the circuit board and the second shielding layer may be arranged in a sixth layer of the circuit board. Alternatively, the first shielding layer may be arranged in the first layer or in the second layer, and the second shielding layer may be arranged in the third layer or in the fourth layer.

The first excitation track and the second excitation track may extend along first direction x. In second direction y, the first shielding layer is arranged at an offset by a first distance from the second excitation track. As an alternative or in addition, the second shielding layer is arranged at an offset by a second distance from the first excitation track in the second direction.

In the third direction, which has an orthogonal orientation to the center plane, the first detector unit is arranged at an offset at a distance from the first shielding layer, the second distance being greater than or equal to 25% of the distance and smaller than or equal to 100% of the distance. Alternatively or in addition, the second detector unit is arranged at an offset at a distance from the second shielding layer, the first distance being greater than or equal to 25% of the distance and smaller than or equal to 100% of the distance. For example, the second distance is greater than or equal to 33% of the distance and smaller than or equal to 75% of the distance, and/or the first distance is greater than or equal to 33% of the distance and smaller than or equal to 75% of the distance.

The first receiver track and the second receiver track may extend along first direction x. The first receiver track is arranged at an offset from the second receiver track in second direction y.

The scanning element may be configured such that the first straight line or the second straight line passes through at least one of the electronic components. Alternatively, the first straight line and the second straight line may pass through one or more electronic components, for example, if the circuit board is fitted with electronic components on both sides.

The circuit board may be configured so that the first straight line passes through the first receiver track of the first detector unit and/or the second straight line passes through the second receiver track of the second detector unit.

The first excitation track and the second excitation track may extend along first direction x, and relative to the second excitation track, the first excitation track is arranged on the circuit board with an overlap in relation to second direction y. In other words, the regions of the first excitation track and the second excitation track overlap in second direction y. More specifically, the overlap may amount to nearly 100% so that the first excitation track is arrange substantially without an offset relative to the second excitation track in second direction y.

The first detector unit may have a third excitation track, and the second detector unit may have a fourth excitation track. In the second direction, the third excitation track is located at an offset from the fourth excitation track.

The scanning element may be configured such that the first excitation track and the second excitation track are electrically connected in series.

The first excitation track and the second excitation track may be energized by an excitation current, which normally has a current intensity that varies over time (alternating current or mixed current). The excitation current can be generated with the aid of the electronic components, which means that its characteristic is able to be shaped by the electronic components. Since a physical relationship exists between the current intensity and the voltage intensity, it is possible to make the same observation also for the excitation voltage.

The particular signals that are able to be generated by the first receiver track and the second receiver track may be processed further with the aid of the electronic components, which, for example, form an evaluation circuit.

The electronic components may thus be elements of different electronic circuits or be allocated to different circuits. For example, certain electronic components can be elements of the circuit for generating an excitation current, or further electronic components may be elements of a further circuit for an evaluation or the further processing of signals.

According to an example embodiment of the present invention, an inductive position measuring device includes a scanning element as described herein, a first scale element, and a second scale element. The scale elements are set apart in third direction z (orthogonal to the center plane) and are placed on both sides of the circuit board. Moreover, the scale elements may be rotatable about a common axis relative to the scanning element.

Further features and aspects of example embodiments of the present invention are described in more detail below with reference to the appended Figures.

DETAILED DESCRIPTION

Figure 1:
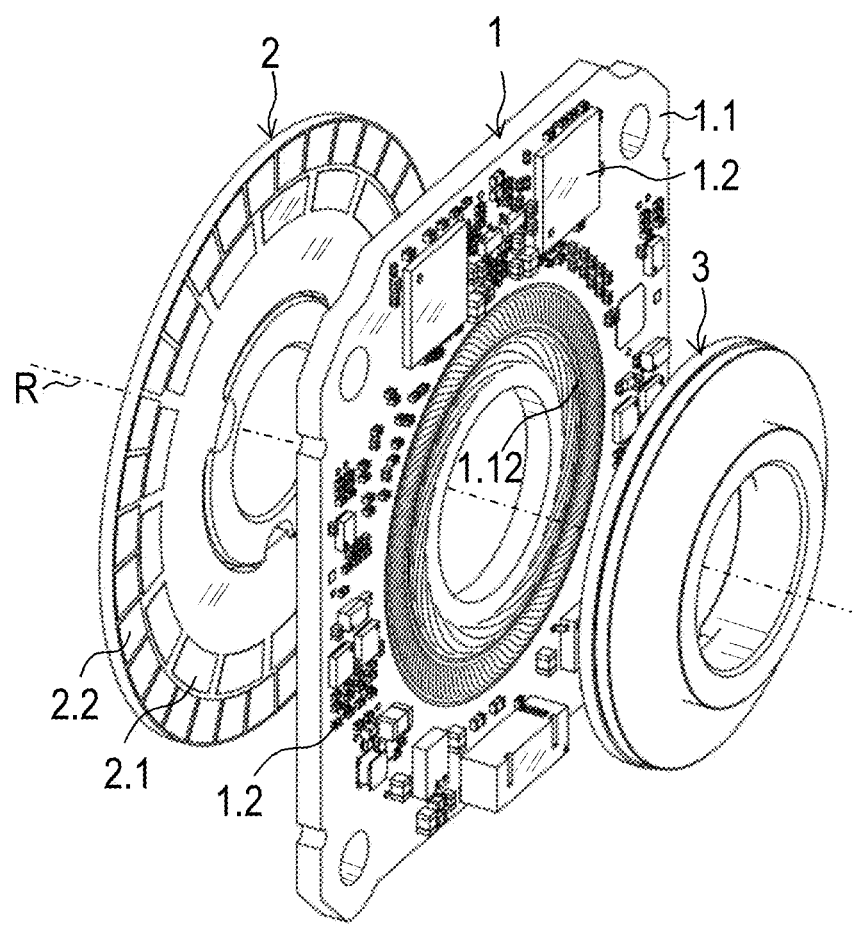
FIG. 1 is a perspective view of a position measuring device including a scanning element, a first scale element, and a second scale element.

Referring to FIG. 1, an example embodiment of the present invention is described based on a position measuring device having a scanning element 1 that is able to be used both for acquiring an angular position of a first scale element 2 and an angular position of a second scale element 3. Both scale elements 2, 3 are arranged so as to be able to rotate about an axis R relative to scanning element 1. Such a position measuring device can be used in a drive device of a robot, for example. Second scale element 3, for example, is connected in a torsionally fixed manner to a drive shaft of a motor. The drive shaft, in turn, is connected to a reduction gear provided with an output shaft. First scale element 2 rotates along with this output shaft. In this manner, an angular position for the commutation of the motor with the aid of second scale element 3 and a relatively highly precise angular position for positioning the robot with the aid of first scale element 2 are able to be obtained, for example.

Figure 2:
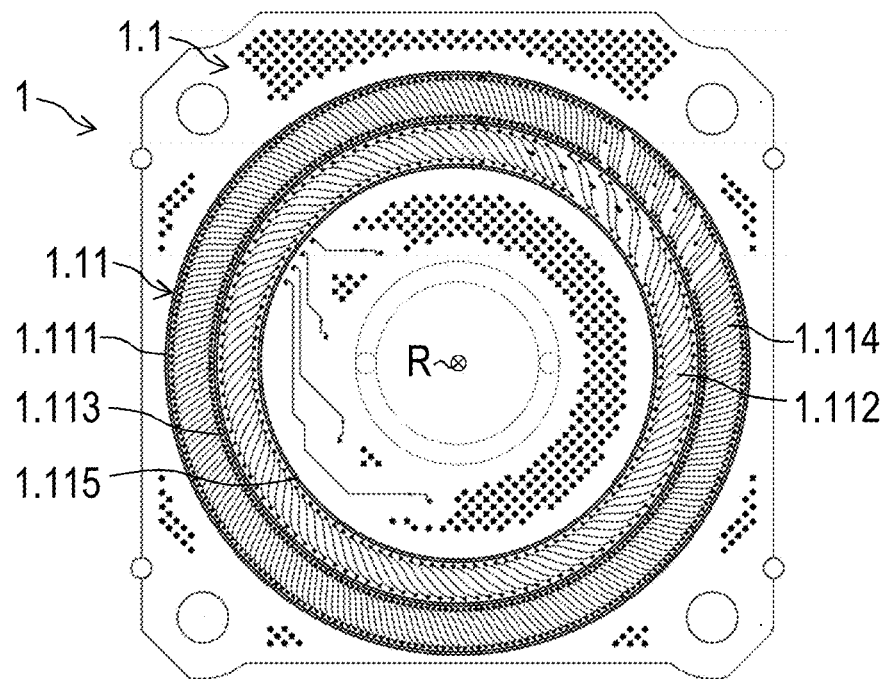
FIG. 2 is a top view of a first side of the scanning element.
Figure 3:
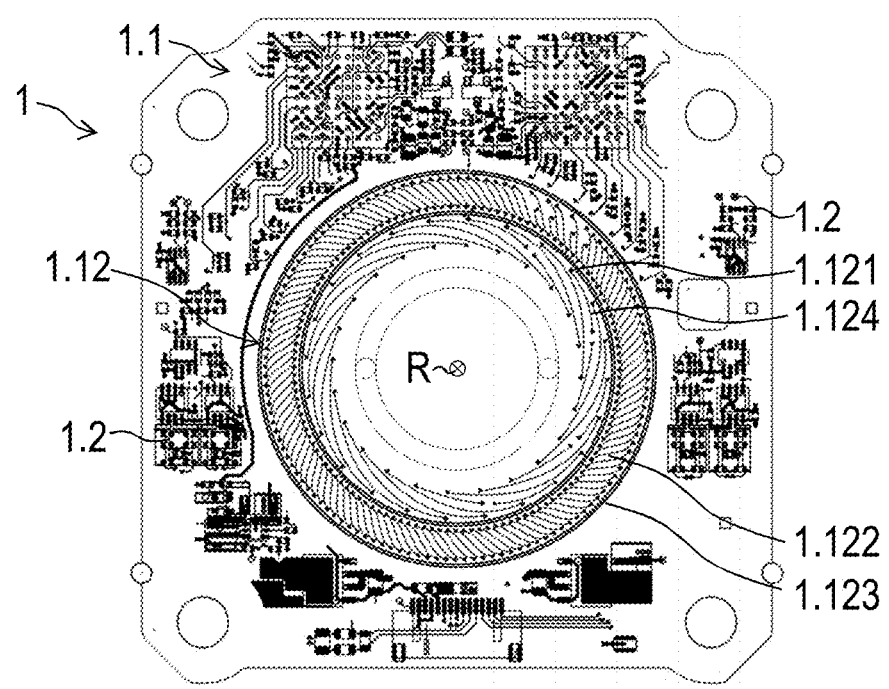
FIG. 3 is a top view of a second side of the scanning element.

Scanning element 1, which is illustrated in a top view in FIGS. 2 and 3, includes a circuit board 1.1 having multiple layers as well as electronic components 1.2 (see, e.g., FIG. 3), which are mounted on circuit board 1.1. Scanning element 1 is used for scanning first scale element 2 and simultaneously for scanning second scale element 3. For this reason, a first detector unit 1.11 is arranged on a first side of circuit board 1.1 according to FIG. 2, and a second detector unit 1.12 is arranged on a second side of circuit board 1.1 according to FIG. 3. In the illustrated exemplary embodiment, electronic components 1.2 are mounted only on the second side. Alternatively or additionally, however, the first side of circuit board 1.1 may also be fitted with electronic components.

First detector unit 1.11 includes a first excitation track 1.111, a first receiver track 1.112, a third excitation track 1.113, a third receiver track 1.114, and a fifth excitation track 1.115. Second detector unit 1.12 includes a second excitation track 1.121, a second receiver track 1.122, a fourth excitation track 1.123, and a fourth receiver track 1.124.

Figure 4:
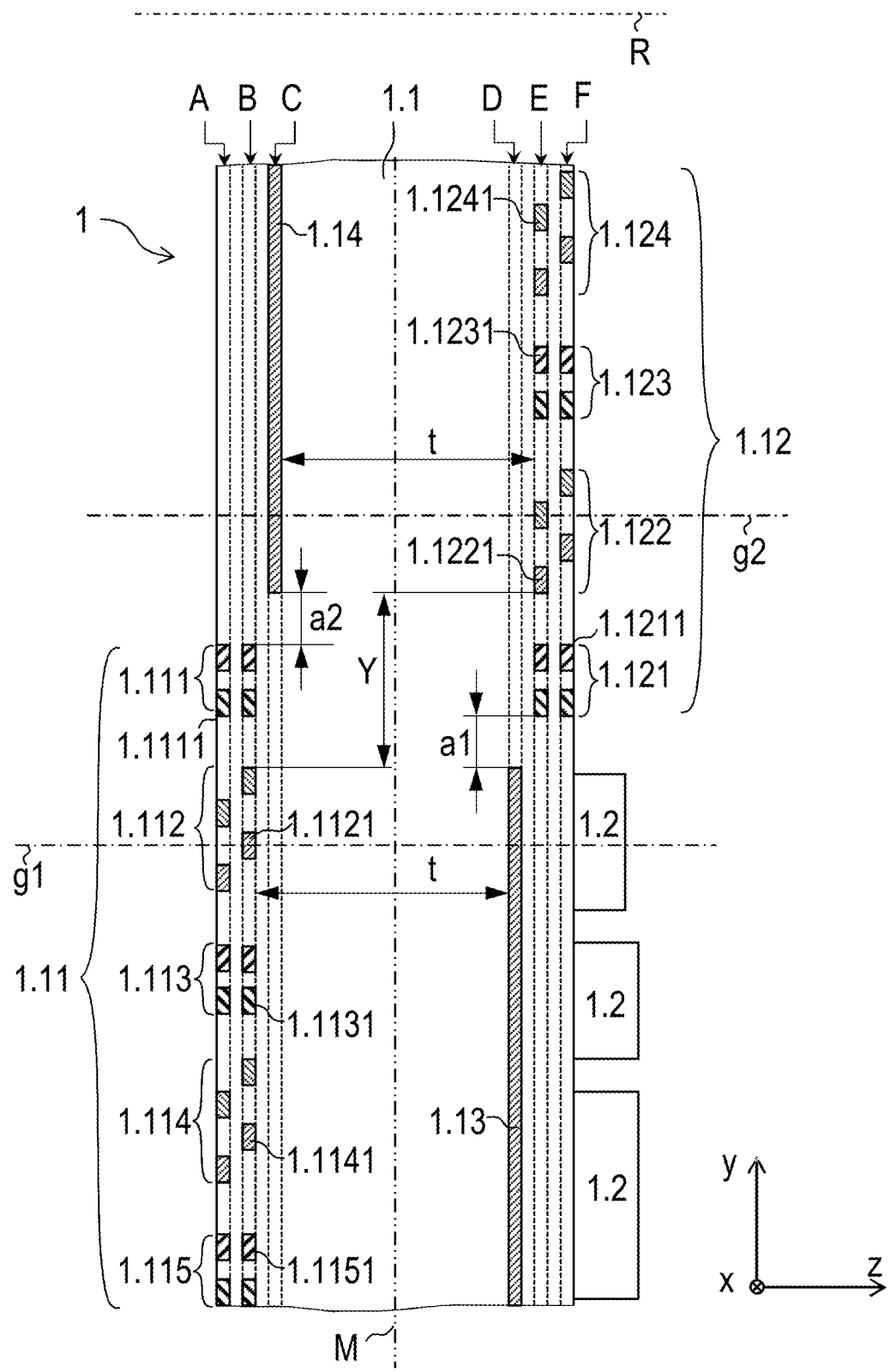
FIG. 4 is an enlarged cross-sectional view through the scanning element according to a first exemplary embodiment.

FIG. 4 is a schematic, partial cross-sectional view through scanning element 1 or through circuit board 1.1 in which cross-hatching of electrically insulating material of circuit board 1.1 is not shown, for reasons of clarity. In addition, the partial cross-sectional view of FIG. 4 is not true to scale, to aid in a better understanding of scanning element 1. As mentioned above, circuit board 1.1 has a multilayer configuration. Viewed geometrically, a so-called center plane M is able to be defined for circuit board 1.1, which is arranged in parallel with the first side or in parallel with the second side of circuit board 1.1 centrally between the first and second side. Moreover, the mutual geometrical relationships of the individual elements are able to be defined with the aid of a coordinate system. In this context, a first direction x is the particular direction along which a position measurement or an angle measurement is to take place according to the intended use. In the illustrated exemplary embodiment, first direction x corresponds to the circumferential direction. Axis R about which scale elements 2, 3 are rotatable extends in parallel with a third direction z so that third direction z may thus also be defined as the axial direction. A second direction y, which may also be denoted as the radial direction in the illustrated exemplary embodiment (e.g., angle measurement), has an orthogonal orientation with respect to third direction z and to first direction x. Thus, a plane defined by the x axis and the y axis has an orientation parallel to center plane M, and third direction z and axis R extend orthogonal to center plane M.

Located in a first layer A of circuit board 1.1 and in a second layer B of circuit board 1.1 is first detector unit 1.11, while second detector unit 1.12 is located in a third layer E and in a fourth layer F. First layer A is located closest to the first side of circuit board 1.1, and second layer B is located second-closest to the first side of circuit board 1.1. The same applies to third layer E and fourth layer F with regard to the second side of circuit board 1.1.

Excitation tracks 1.111, 1.113, 1.115 of first detector unit 1.11 include excitation conductor tracks 1.1111, 1.1131, 1.1151, which extend in first layer A and in second layer B. In a similar manner, excitation tracks 1.121, 1.123 of second detector unit 1.12 include excitation conductor tracks 1.1211, 1.1231, which extend in third layer E and in fourth layer F.

Excitation tracks 1.111, 1.113, 1.115 of first detector unit 1.11 enclose first receiver track 1.112 or third receiver track 1.114. Second excitation track 1.121 and fourth excitation track 1.123 of second detector unit 1.12 enclose second receiver track 1.122 of second detector unit 1.12. Fourth receiver track 1.124, which likewise is to be allocated to second detector unit 1.12, is enclosed by fourth excitation track 1.123 on one side. Excitation tracks 1.111, 1.121, 1.113, 1.115, 1.121, 1.123 as well as receiver tracks 1.112, 1.114, 1.122, 1.124 extend along first direction x.

Each receiver track 1.112, 1.114, 1.122, 1.124 includes at least two receiver conductor tracks 1.1121, 1.1141, 1.1221, 1.1241. In addition, receiver conductor tracks 1.1121, 1.1141 of first detector unit 1.11 extend with vias in different layers of circuit board 1.1, i.e., in first layer A and in second layer B, so that undesired short circuits at junctions are avoided. The same also applies to receiver conductor tracks 1.1221, 1.1241 of second detector unit 1.12, which extend in third layer E and in fourth layer F. Receiver conductor tracks 1.1121, 1.1141, 1.1221, 1.1241 have a spatially periodic characteristic, which has a substantially sinusoidal or sine-type configuration. In the illustrated exemplary embodiment, the particular receiver conductor tracks 1.1121, 1.1141, 1.1221, 1.1241 which are arranged in one and the same receiver track 1.112, 1.114, 1.122, 1.124 are arranged at an offset by ¼ of the full sine period (by π/2 or 90° along first direction x) from one another. Receiver conductor tracks 1.1121, 1.1141, 1.1221, 1.1241 are electrically connected such that they are ultimately able to supply signals that are offset in phase by 90° in first direction x with regard to the position determination in first direction x.

In the illustrated exemplary embodiment, circuit board 1.1 also has a fifth layer C and a sixth layer D. Arranged in sixth layer D is a first shielding layer 1.13, and a second shielding layer 1.14 is arranged in fifth layer C. Shielding layers 1.13, 1.14 are relatively large-area copper layers, for example, which are partially interrupted or partially removed.

First shielding layer 1.13 is dimensioned so that a first straight line g1 is able to be produced, which has an orientation orthogonal to center plane M and parallel to third direction z, which intersects or passes through both first detector unit 1.11 and first shielding layer 1.13. Furthermore, first straight line g1 also passes through an electronic component 1.2. At the same time, however, first straight line g1 does not pass through second shielding layer 1.14. In addition, starting from first detector unit 1.11, first shielding layer 1.13 is arranged beyond center plane M, i.e., on the other side of center plane M when viewed from the direction of first detector unit 1.11.

Furthermore, second shielding layer 1.14 is dimensioned so that a second straight line g2 is able to be produced, which has an orthogonal orientation to center plane M, and passes through both second detector unit 1.12 and second shielding layer 1.14. Second straight line g2 does not pass through first shielding layer 1.13. Starting from second detector unit 1.12, second shielding layer 1.14 is located beyond center plane M.

Circuit board 1.1 is configured, for example, such that first straight line g1 passes through first receiver track 1.112 of first detector unit 1.11, and second straight line g2 passes through second receiver track 1.122 of second detector unit 1.12.

As a result of the described arrangement, first shielding layer 1.13 is located behind first detector unit 1.11 and at a distance t in relation to third direction z (or at an offset in third direction z from first detector unit 1.11). Distance t is greater than one half of the thickness of circuit board 1.1. The same applies to the relative arrangement of second shielding layer 1.14 relative to second detector unit 1.12. In the illustrated exemplary embodiment, distance t amounts to 2 mm, for example, and the distance extends in third direction z.

First receiver track 1.112 is arranged at an offset Y from second receiver track 1.122 in second direction y. In contrast, first excitation track 1.111 has no offset at all from second excitation track 1.121 in second direction y in the illustrated exemplary embodiment, so that first excitation track 1.111 thus is arranged on first circuit board 1.1 without an offset relative to second excitation track 1.121 in second direction y.

First shielding layer 1.13 does not reach second excitation track 1.121 in relation to second direction y, but there is a (radial) first distance a1 in second direction y between first shielding layer 1.13 and second excitation track 1.121. In the same manner, a second distance a2 in second direction y is located between second shielding layer 1.14 and first excitation track 1.111. As a result, first shielding layer 1.13 is located at an offset from second excitation track 1.121 by first distance a1, and second shielding layer 1.14 is furthermore located at an offset from first excitation track 1.111 by second distance a2. A high quality of the measuring signals and thus a high measuring accuracy as a whole may be achieved if first distance a1 and/or second distance a2 assume(s) a value of between 25%·t and 100%·t (0.25·t≤a1≤1·t; 0.25·t≤a2≤1·t). In the illustrated exemplary embodiment, a1=a2.

Figure 5:
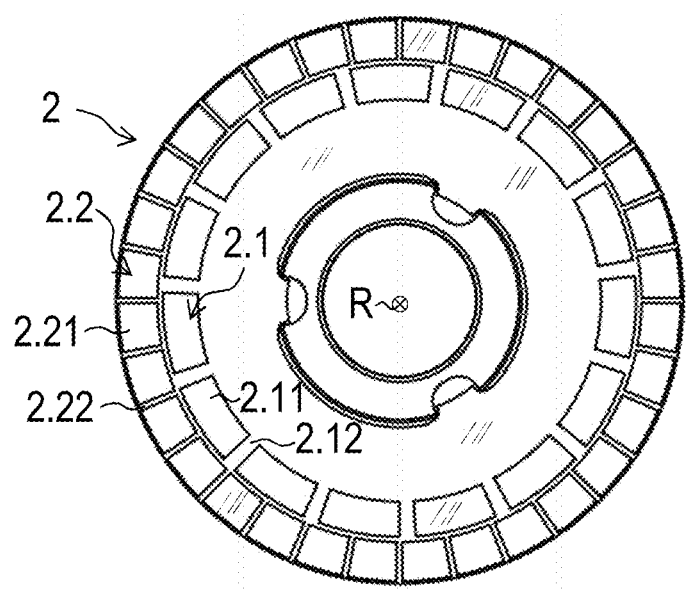
FIG. 5 is a top view of a first scale element.
Figure 6:
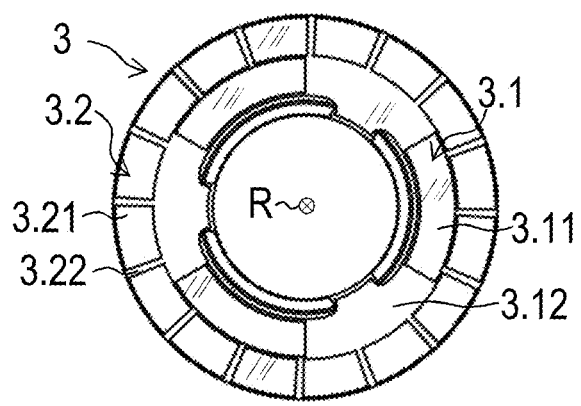
FIG. 6 is a top view of a second scale element.

FIG. 5 is a top view of first scale element 2, and FIG. 6 is a top view of second scale element 3. Scale elements 2, 3 include a substrate, which is produced from epoxy resin in the illustrated exemplary embodiment and on which two graduation tracks 2.1, 2.2; 3.1, 3.2 are arranged in each case. Graduation tracks 2.1, 2.2; 3.1, 3.2 have an annular configuration and are arranged on the substrate with different diameters in a concentric fashion in relation to axis R. Graduation tracks 2.1, 2.2; 3.1, 3.2 include a periodic sequence of alternatingly arranged electrically conductive graduation regions 2.11, 2.21; 3.11, 3.21 and non-conductive graduation regions 2.12, 2.22; 3.12, 3.22. In the illustrated example, copper is applied to the substrate as the material for electrically conductive subregions 2.11, 2.21; 3.11, 3.21. In the non-conductive graduation regions 2.12, 2.22; 3.12, 3.22, on the other hand, the substrate is not coated. The arrangement with two graduation tracks 2.1, 2.2; 3.1, 3.2 in each case makes it possible to perform an absolute determination of the angular positions of scale elements 2, 3. Outermost graduation track 2.2 of first scale element 2 has the greatest number of graduation regions 2.11, 2.21 along a circumferential line, so that the greatest resolution with regard to the measurement of the angular position thus is achievable with their aid.

In the assembled state, illustrated in FIG. 1, scanning element 1 and scale elements 2, 3 are arranged opposite one another with an axial clearance or an air gap so that in a relative rotation between scale elements 2, 3 and scanning element 1, a signal as a function of the respective angular position is able to be generated in receiver conductor tracks 1.1121, 1.1141, 1.1221, 1.1241 through induction effects. A precondition for the generation of corresponding signals is that excitation conductor tracks 1.1111, 1.1131, 1.1141, 1.1211, 1.1231 generate an electromagnetic excitation field that is variable over time in the region of the scanned graduation structures. In the illustrated exemplary embodiment, excitation conductor tracks 1.1111, 1.1131, 1.1141, 1.1211, 1.1231 are arranged as a plurality of planar-parallel single conductor tracks through which a current flows. Scanning element 1 has an electronic circuit with electronic components 1.2, which are electrically connected to one another by layers E and F. For example, the electronic circuit may also include an ASIC part. This electronic circuit of scanning element 1 operates not only as an evaluation element but also as an excitation control element under whose control the excitation current is generated or produced which flows through excitation conductor tracks 1.1111, 1.1131, 1.1141, 1.1211, 1.1231. As a result, excitation conductor tracks 1.1111, 1.1131, 1.1141, 1.1211, 1.1231 are energized by one and the same excitation control element. First excitation track 1.111 and second excitation track 1.121 are electrically connected in series.

When excitation tracks 1.111, 1.121, 1.113, 1.115, 1.121, 1.123 are energized, an electromagnetic field, which is oriented in the shape of a hose or cylinder, forms around excitation conductor tracks 1.1111, 1.1131, 1.1141, 1.1211, 1.1231. The field lines of the resulting electromagnetic field extend around excitation tracks 1.111, 1.121, 1.113, 1.115, 1.121, 1.123, the direction of the field lines depending on the current direction in excitation conductor tracks 1.1111, 1.1131, 1.1141, 1.1211, 1.1231. Eddy currents are induced in the area of conductive subregions 2.11, 2.21; 3.11, 3.21 so that a modulation of the field is achieved as a function of the angular position. Accordingly, the receiver tracks 1.112, 1.114, 1.122, 1.124 are able to measure the relative angular position. The pairs of receiver conductor tracks 1.1121, 1.1141, 1.1221, 1.1241 are arranged in their receiver track 1.112, 1.114, 1.122, 1.124 such that they supply signals that are phase-offset by 90° so that a determination of the direction of rotation is able to be performed as well. The signals generated by receiver tracks 1.112, 1.114, 1.122, 1.124 are further processed with the aid of some of electronic components 1.2, which form an evaluation circuit.

The special dimensioning and placement of first shielding layer 1.13 and second shielding layer 1.14 makes it possible to largely prevent a negative effect on the two detector units 1.11, 1.12 with regard to the measuring accuracy.

For example, an impermissibly high measure of crosstalk signals is prevented but excessive damping of the excitation fields is avoided at the same time. In addition, the electromagnetic interference of detector units 1.11, 1.12 by electronic components 1.2 or from external sources is prevented.

Figure 7:
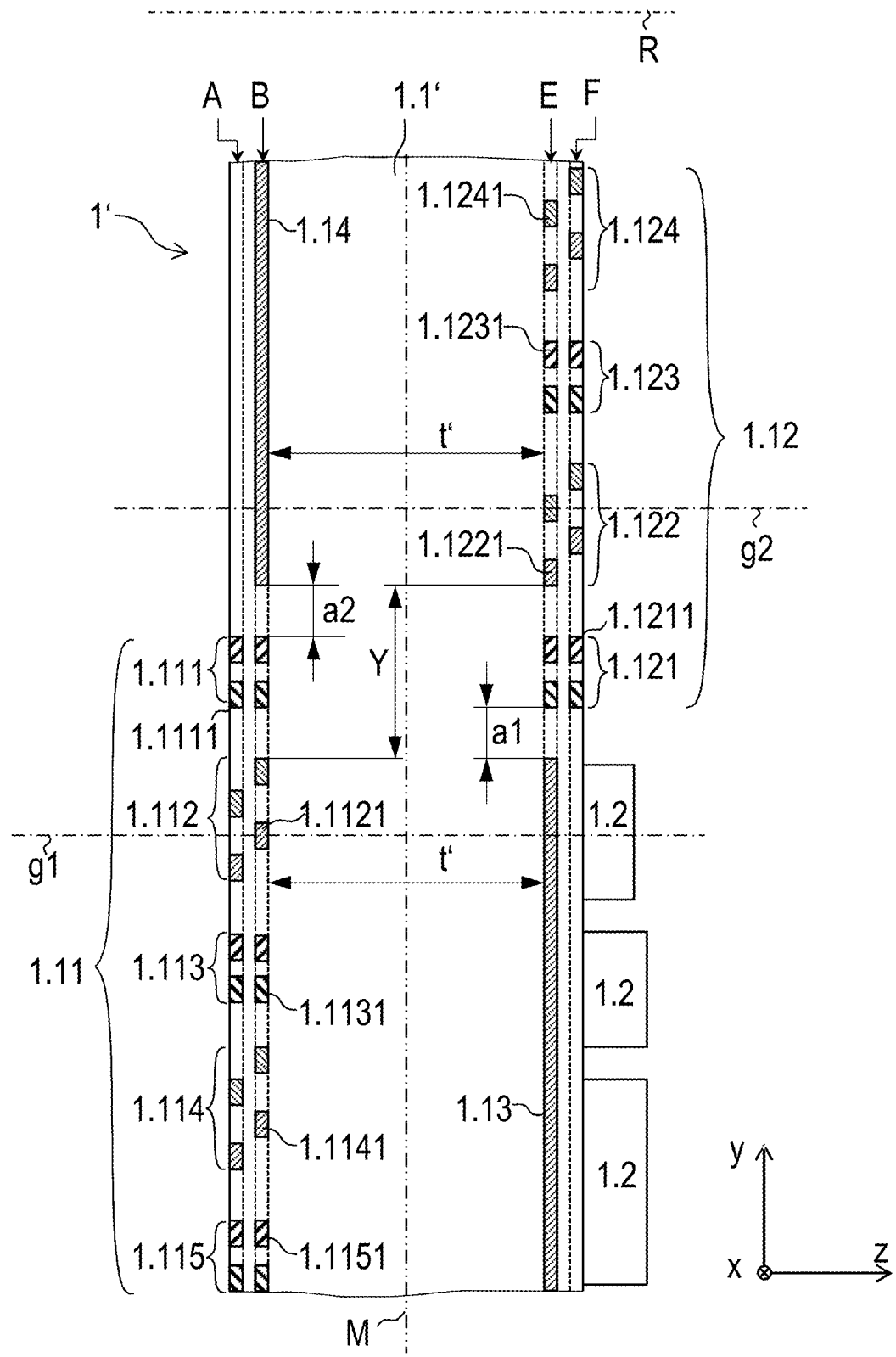
FIG. 7 is an enlarged cross-sectional view through the scanning element according to a second exemplary embodiment.

FIG. 7 illustrates a scanning element 1' according to a second exemplary embodiment. Circuit board 1.1' of the second exemplary embodiment has only four layers A, B, C, D. First shielding layer 1.13 in this exemplary embodiment is arranged in third layer E and second shielding layer 1.14 is arranged in second layer B. Here, too, distance t' is considerably greater than half of the thickness of circuit board 1.1'. As an alternative, it is also possible to place first shielding layer 1.13 in first layer A and/or second shielding layer 1.14 in fourth layer F.

What is claimed is:

1. A scanning element for an inductive position measuring device, comprising:
   a multilayer circuit board including a first detector unit, a second detector unit, a first shielding layer, a second shielding layer, and a geomatical center plane located between the detector units and the shielding layers, the first detector unit including a first excitation track and a first receiver track, the second detector unit including a second excitation track and a second receiver track;

wherein the first detector unit is arranged in a first layer and in a second layer, and the second detector unit is arranged in a third layer and in a fourth layer;

wherein a first straight line passes through both the first detector unit and the first shielding layer but does not pass through the second shielding layer, and starting from the first detector unit, the first shielding layer is located beyond the center plane;

wherein a second straight line passes through both the second detector unit and the second shielding layer but does not pass through the first shielding layer, and starting from the second detector unit, the second shielding layer is located beyond the center plane; and wherein the first straight line and the second straight line are orthogonal with respect to the center plane.

2. The scanning element according to claim 1, wherein the first shielding layer is located in a fifth layer, and the second shielding layer is located in a sixth layer.

3. The scanning element according to claim 1, wherein the first shielding layer is arranged in the first layer or in the second layer, and the second shielding layer is arranged in the third layer or in the fourth layer.

4. The scanning element according to claim 1, wherein the first receiver track and the second receiver track extend along a first direction, and the first receiver track is located at an offset from the second receiver track in a second direction.

5. The scanning element according to claim 4, wherein the first direction is orthogonal to the second direction.

6. The scanning element according to claim 1, wherein the first excitation track and the second excitation track extend along a first direction, and, in a second direction that is orthogonal to the first direction:

the first shielding layer is located at an offset by a first distance from the second excitation track; and/or the second shielding layer is located at an offset by a second distance from the first excitation track.

7. The scanning element according to claim 6, wherein, in a third direction orthogonal to the center plane: (a) the first detector unit is located at an offset from the first shielding layer by a third distance, and the second distance is greater than or equal to 25% of the third distance and is less than or equal to 100% of the third distance; and/or (b) the second detector unit is located at an offset from the second shielding layer by a fourth distance, and the first distance is greater than or equal to 25% of the fourth distance and is less than or equal to 100% of the fourth distance.

8. The scanning element according to claim 7, wherein the third distance and the fourth distance are equal.

9. The scanning element according to claim 1, wherein the first straight line and/or the second straight line passes through an electronic component of the scanning element.

10. The scanning element according to claim 1, wherein the first straight line passes through the first receiver track and/or the second straight line passes through the second receiver track.

11. The scanning element according to claim 1, wherein the first excitation track and the second excitation track extend along a first direction, and the first excitation track and the second excitation track overlap in a second direction.

12. The scanning element according to claim 11, wherein the first direction is orthogonal to the second direction.

13. The scanning element according to claim 11, wherein the first excitation track is arranged substantially without any offset in the second direction relative to the second excitation track.

14. The scanning element according to claim 1, wherein the first detector unit includes a third excitation track, and the second detector unit includes a fourth excitation track.

15. The scanning element according to claim 1, wherein the first excitation track and the second excitation track are electrically connected in series.

16. The scanning element according to claim 1, wherein the scanning element includes electronic components adapted to generate an excitation current, which varies over time, to energize the first excitation track and the second excitation track.

17. The scanning element according to claim 1, wherein the scanning element includes electronic components adapted to process signals generated by the first receiver track and the second receiver track.

18. An inductive position measuring device, comprising:
a first scale element;
a second scale element; and
a scanning element including a multilayer circuit board, the circuit board including a first detector unit, a second detector unit, a first shielding layer, a second shielding layer, and a geomatical center plane located between the detector units and the shielding layers, the first detector unit including a first excitation track and a first receiver track, the second detector unit including a second excitation track and a second receiver track;
wherein the first detector unit is arranged in a first layer and in a second layer, and the second detector unit is arranged in a third layer and in a fourth layer;
wherein a first straight line passes through both the first detector unit and the first shielding layer but does not pass through the second shielding layer, and starting from the first detector unit, the first shielding layer is located beyond the center plane;
wherein a second straight line passes through both the second detector unit and the second shielding layer but does not pass through the first shielding layer, and starting from the second detector unit, the second shielding layer is located beyond the center plane;
wherein the first straight line and the second straight line are orthogonal with respect to the center plane; and
wherein the scale elements are arranged in a third direction that is orthogonal to the center plane and are spaced apart on both sides of the circuit board.

19. The inductive position measuring device according to claim 18, wherein the scale elements are rotatable about a common axis relative to the scanning element.

20. The inductive position measuring device according to claim 18, wherein the scale elements are independently rotatable about a common axis relative to the scanning element.

* * * * *